(12) United States Patent
Yu

(10) Patent No.: US 6,235,542 B1
(45) Date of Patent: May 22, 2001

(54) FERROELECTRIC MEMORY DEVICE AND METHOD FOR FABRICATING THE SAME

(75) Inventor: Yong Sik Yu, Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/346,089

(22) Filed: Jul. 1, 1999

(30) Foreign Application Priority Data

Jul. 2, 1998 (KR) .................................................. 98-26553

(51) Int. Cl.[7] .................................................. H01L 21/00
(52) U.S. Cl. .............................. 438/3; 438/240; 438/393; 438/239; 438/250
(58) Field of Search ................................ 438/389, 3, 393, 438/763, 396, 240, 239, 250; 257/295, 310, 211

(56) References Cited

U.S. PATENT DOCUMENTS

| 5,382,787 | 1/1995 | Takada et al. | 250/214.1 |
|---|---|---|---|
| 5,418,389 | 5/1995 | Watanabe | 257/295 |
| 5,516,363 | 5/1996 | Azuma et al. | 106/287.18 |
| 5,527,766 | 6/1996 | Eddy | 505/410 |
| 5,541,807 * | 7/1996 | Evans, Jr. et al. | 361/321.5 |
| 5,580,814 * | 12/1996 | Larson | 437/52 |
| 5,635,730 | 6/1997 | Sakakibara | 257/34 |
| 5,729,054 * | 3/1998 | Summerfelt | 257/751 |
| 5,751,061 * | 5/1998 | Satoh et al. | 252/532 |
| 5,824,590 * | 10/1998 | New | 438/393 |
| 5,976,946 * | 11/1999 | Matsuki et al. | 438/393 |

FOREIGN PATENT DOCUMENTS

| 09246510 | 9/1997 | (JP) | H01L/27/14 |
|---|---|---|---|
| 10294433 | 11/1998 | (JP) | H01L/27/10 |

* cited by examiner

Primary Examiner—Matthew Smith
Assistant Examiner—Belur Keshavan
(74) Attorney, Agent, or Firm—Ladas & Parry

(57) ABSTRACT

A method for fabricating a ferroelectric memory device, comprising the steps of: providing a semiconductor substrate where a transistor having an impurity region is formed; forming a conduction layer for storage node over the substrate; forming a ferroelectric film on the conduction layer; patterning the conduction layer and the ferroelectric film to form a storage node and a dielectric film; forming a protection film for dielectric film over the semiconductor substrate to cover the storage node and the dielectric film; patterning the protection film to expose a selected portion of the dielectric film; and forming a plate node on the dielectric film.

19 Claims, 4 Drawing Sheets

FERROELECTRIC MEMORY DEVICE AND METHOD FOR FABRICATING THE SAME

BACKGROUND OF THE INVENTION

This invention relates to a method for fabricating a semiconductor memory device, and more particularly to a semiconductor memory device and a method for fabricating the same where a ferroelecric film is used as a dielectric film of a capacitor.

In general, a ferroelectric memory device is nonvolatile and the data stored in the ferroelectric memory device are not removed in power off. However, if the thickness of the dielectric capacitor is very thin, spontaneous polarization is fast occurred so that the ferroelectric memory device is able to read out the data therefrom or write the data therein with high speed. The ferroelectric memory device may constitute memory cells which each thereof is comprised of a transistor and a ferroelectric capacitor so that it is applicable to semiconductor memory device with large capacity. There are typically $SrBi_2Ta_2O_9$(SBT), PZT and $PbZrO_3$ as the ferroelectric film.

FIG. 1 is a diagram illustrating a method for fabricating a capacitor using SBT film as a dielectric film. Referring to FIG. 1, on a semiconductor substrate 11 where a node (not shown) is formed, a first intermediate insulating layer 12 is formed. A glue layer 13 and a conduction layer 14 for storage node are formed on the first intermediate insulating layer 12 in turn. A Ti layer is used for the glue layer 12 and a Pt layer is used for the conduction layer for storage node. A SBT film 15 is deposited on the conduction layer 14 and a conduction layer 16 for plate node is deposed on the SBT film.

The conduction layer 16 for plate node and the SBT film 15 are patterned. Then, a second intermediate insulating layer 17 is deposited over the conduction layer 14 for storage node including the SBT film 15 and the conduction layer 16 for plate. At this time, a spin on glass (SOG) film having a planarization property is used for the second intermediate insulating layer 17.

The second intermediate insulating layer 17 is etched to expose a selection portion of the conduction layer 16 for plate electrode. An Al metal layer 18 is formed on the second intermediate insulating layer to be contacted with the exposed conduction layer 16 for plate node. An antireflection film 19 is formed on the Al metal layer 18 and the Al metal layer 18 and the antireflection film 19 are patterned to form a metal interconnection layer 20.

However, if a high temperature process such as the second intermediate insulating layer formation process is accomplished following the SBT film deposition, bismuth(Bi) within the SBT film 15 is easily volatile so that the hysterisis property of the SBT film is degraded.

Furthermore, the SBT film 15 is apt to damage by the following process and in depositing the second intermediate insulating layer 17, the exposed portion of the SBT film 15 and chemicals for forming the second intermediate insulating layer 17 are reacted with each other so that leakage current flows through the SBT film 15. Therefore, reliability of the memory devices is degraded.

SUMMARY OF THE INVENTION

It is an object of the present invention to prevent Bi within a SBT film being volatile.

It is another object of the present invention to prevent leakage current from generating with a SBT film.

It is an aspect of the present invention to provide a method for fabricating a ferroelectric memory device, comprising the steps of: providing a semiconductor substrate where a transistor having an impurity region is formed; forming a conduction layer for storage node over the substrate; forming a ferroelectric film on the conduction layer; patterning the conduction layer and the ferroelectric film to form a storage node and a dielectric film; forming a protection film for dielectric film over the semiconductor substrate to cover the storage node and the dielectric film; patterning the protection film to expose the dielectric film; and forming a plate node on the dielectric film.

The method further comprises the step of forming a glue layer over the semiconductor substrate before formation of the conduction layer. The glue layer is comprised of one of Ti layer or Ta layer and formed at a thickness of 100 to 1000 Å.

The conduction layer for storage node is comprised of a Pt layer and formed at a thickness of 1000 to 5000 Å.

The method further comprises the step of furnace-annealing the conduction layer at a temperature of 500 to 700° C. during 10 to 60 minutes at ambient of oxygen between conduction layer formation and ferroelectric film formation. The ferroelectric film is formed with spin coating and comprised of $SrBi_2Ta_2O_9$ (SBT) film.

The formation step of the SBT film includes the steps of: forming a first SBT film over the conduction layer for storage node; drying the first SBT film; rapid-thermally annealing the dried first SBT film; forming a second SBT film on the first SBT film; drying the second SET film; and rapid-thermally annealing the dried second SBT film.

The method further comprises the step of furnace-annealing the first and second SBT films after the rapid-thermally annealing step of the dried second SBT film. The furnace annealing step is carried out at a temperature of 700 to 800° C. during 10 to 60 minutes at ambient of oxygen. The first and second SBT films are first dried at a temperature of 160 to 180° C. during 1 to 5 minutes and then second dried at a temperature of 260 to 280° C. during 1 to 5 minutes.

The rapid-thermally annealing step is carried out at a temperature of 700 to 800° C. during 10 to 60 seconds at ambient of oxygen. The first and second SBT films are formed at a thickness of 800 to 1200 Å.

The protection film for dielectric film is comprised of $SrTiO_3$ and deposited at a temperature of 300 to 550° C. with chemical vapor deposition at a thickness of 500 to 2000 Å.

The plate node is comprised of a Pt layer.

The method further comprises the steps of forming an intermediating insulating layer over the protect-ion film and the plate node; etching the intermediating layer to expose the impurity region of the transistor and the plate node, thereby forming contact holes; and forming a metal interconnection layer over the intermediate insulating layer to be contacted with the impurity region and the plate node through the contact holes.

It is another aspect of the present invention to provide a ferroelectric memory device, comprising: a semiconductor substrate where a transistor having an impurity region; a storage node formed over the substrate; a ferroelectric film formed on the storage node; a plate node formed on the ferroelectric film; and a protection film for dielectric film over the semiconductor substrate to cover the storage node, the dielectric film and the plate node.

The ferroelectric film is comprised of SrBi2Ta2O9 (SBT) film and the protection film is comprised of SrTiO3.

According to the present invention, the protection film of SrTiO3 is formed to cover the dielectric film of SBT film, so that the dielectric film is chemically and thermally stable in the following etching or high temperature thermal oxidation process, thereby preventing Bi within the dielectric film being volatile. Therefore, the hysterisis property of the dielectric film can be improved and leakage current can be reduced.

BRIEF DESCRIPTION OF DRAWINGS

The objects and features of the invention may be understood with reference to the following detailed description of an illustrative embodiment of the invention, taken together with the accompanying drawings in which.

DETAILED DESCRIPTION OF THE INVENTION

FIG. 2A through FIG. 2E are sectional views illustrating a method for fabricating a ferroelectric capacitor in accordance with an embodiment of the present invention.

Figure 1:
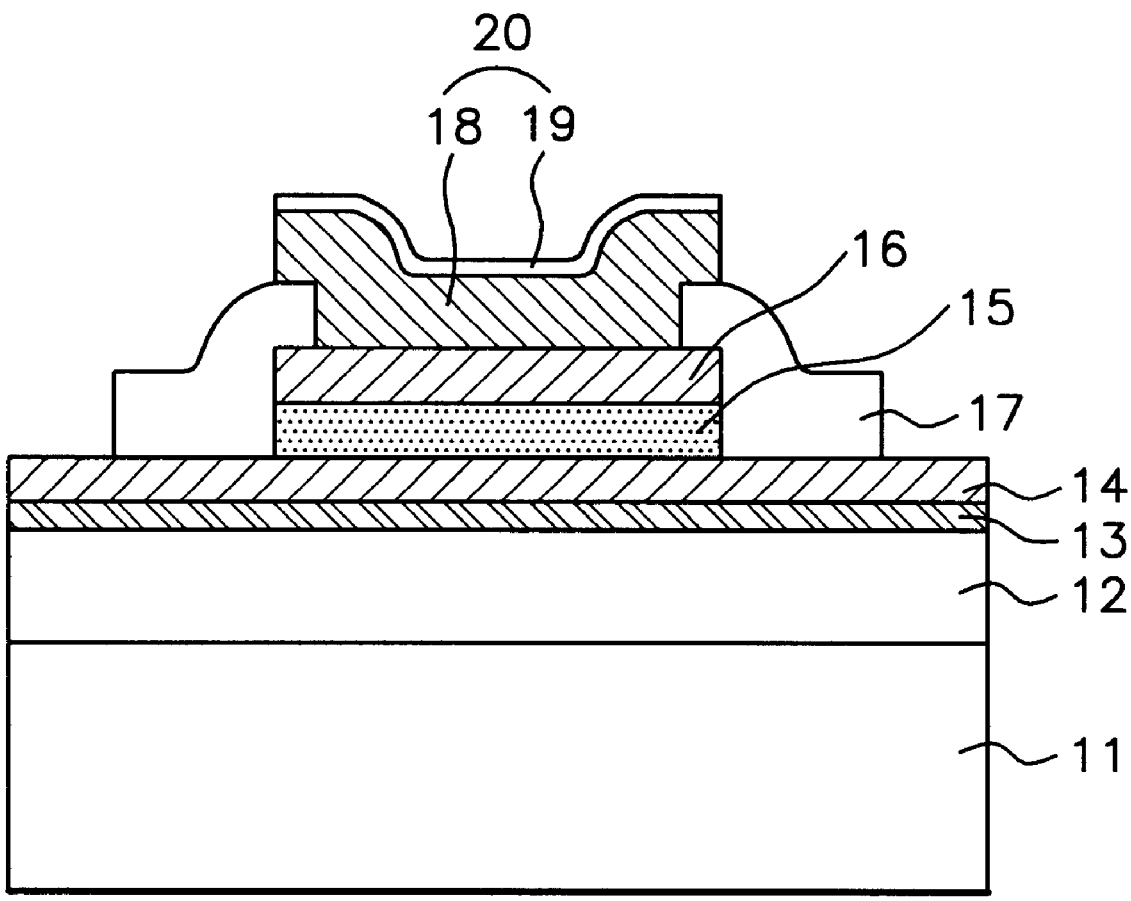
FIG. 1 is a sectional view of a ferroelectric capacitor in the prior art.
Figure 2A:
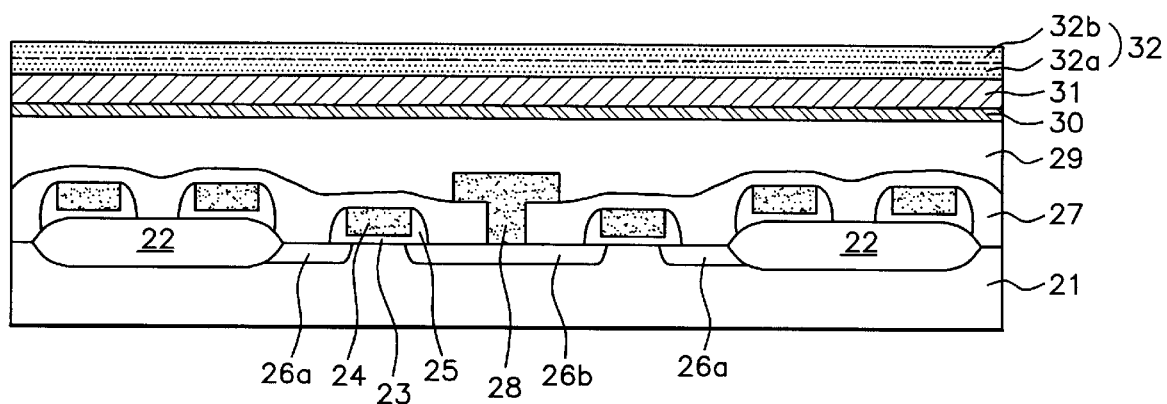
FIG. 2A through FIG. 2E are sectional views illustrating a method for fabricating a ferroelectric capacitor in accordance with an embodiment of the present invention.

Referring to FIG. 2A, a field oxide 22 is formed in a semiconductor substrate 21 by using a conventional LOCOS. Gates 24 with gate oxides 23 are formed on the field oxide 22 and the semiconductor substrate 21. Sidewall spacers 25 are formed in the side walls of the gates 24 with a conventional method. Source and drain regions 26a and 26b are formed in the semiconductor substrate 21 on the both sides of the gates 24 so that transistors are formed.

A first intermediate insulating layer 27 is formed over the substrate 21 where transistors are formed and then is etched to expose the drain region 26b. A bit line 28 is formed over the first intermediate insulating layer 27 to be contacted with the drain region 26b. A second intermediate insulating layer 29 is formed at a thickness of 100 to 1000 Å over the first intermediate insulating layer 27.

A glue layer 30 is deposited on the second intermediate insulating layer 29 and is comprised of one of Ti layer or Ta layer. A first conduction layer 31 for storage node, for example a Pt layer is deposited at a thickness of 100 to 5000 Å on the glue layer 30. So as to crystallize the first conduction layer 31, a furnace annealing is carried out at: a temperature of 500 to 700° C. during 10 to 60 minutes at ambient of oxygen, A first SBT film 32a is formed at a thickness of 800 to 1200 Å over the first conduction layer 31 with spin coating. The first SBT film 32a is first dried at a temperature of 160 to 180° C. during 1 to 5 minutes and then is second dried at a temperature of 260 to 280° C. during 1 to 5 minutes. The dried SBT film 32a is treated with a rapid thermal annealing at a temperature of 600 to 800° C. during 10 to 60 seconds at ambient of oxygen. A second SBT film 32b is formed with the same method as the first SBT film formation method.

Then, so as to crystallize the first and second SBT films 32a and 32b, a furnace annealing is carried out at a temperature of 700 to 800° C. during 10 to 60 minutes at ambient of oxygen to form a ferroelectric film 32.

Figure 2B:
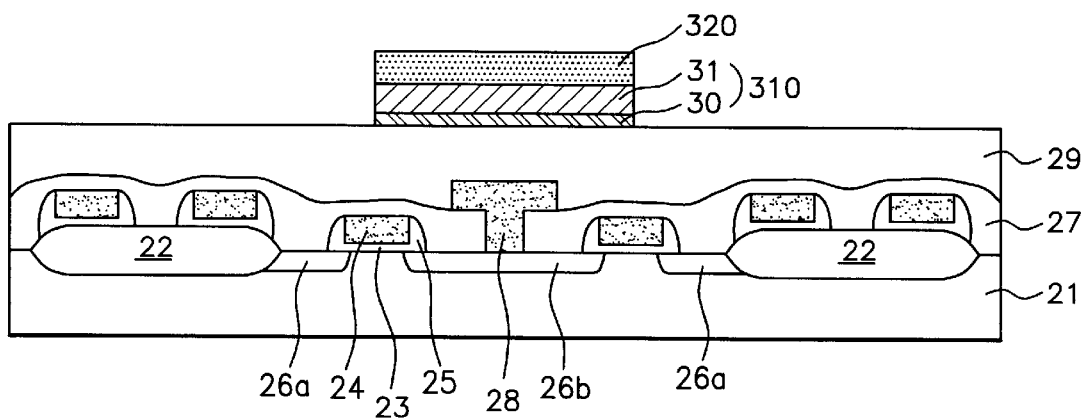

Referring to FIG. 2B, a resist pattern (not shown) for defining a storage node is formed on the ferroelectric film 32 with a photolithography and the ferroelectric film 32 and the first conduction layer. 31 and the glue layer 30 are etched using the resist pattern as a mask to form a storage node 310 and a dielectric film 320. Then the resist pattern is removed.

Figure 2C:
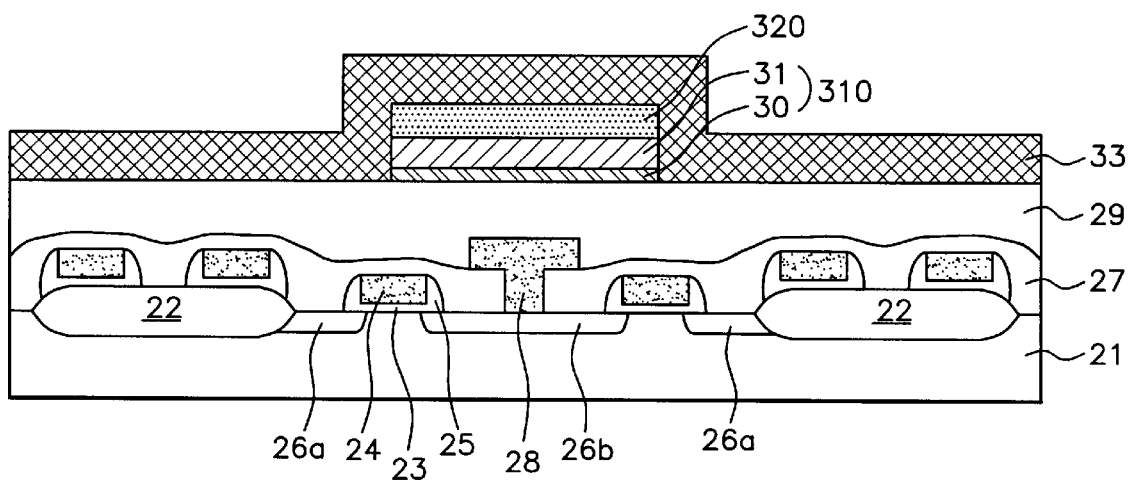

Referring to FIG. 2C, a protection film 33 for dielectric film is formed over the second intermediate insulating layer 29 to cover the storage node 310 and the dielectric film 320. The dielectric protection film 33 blocks the dielectric film 320 to be exposed, thereby preventing Bi within the dielectric film 320 being volatile. The dielectric protection film 33 is comprised of SrTiO3 and is deposited by CVD at a temperature range of 300 to 550° C. which has no effect on the dielectric film 320.

Figure 2D:
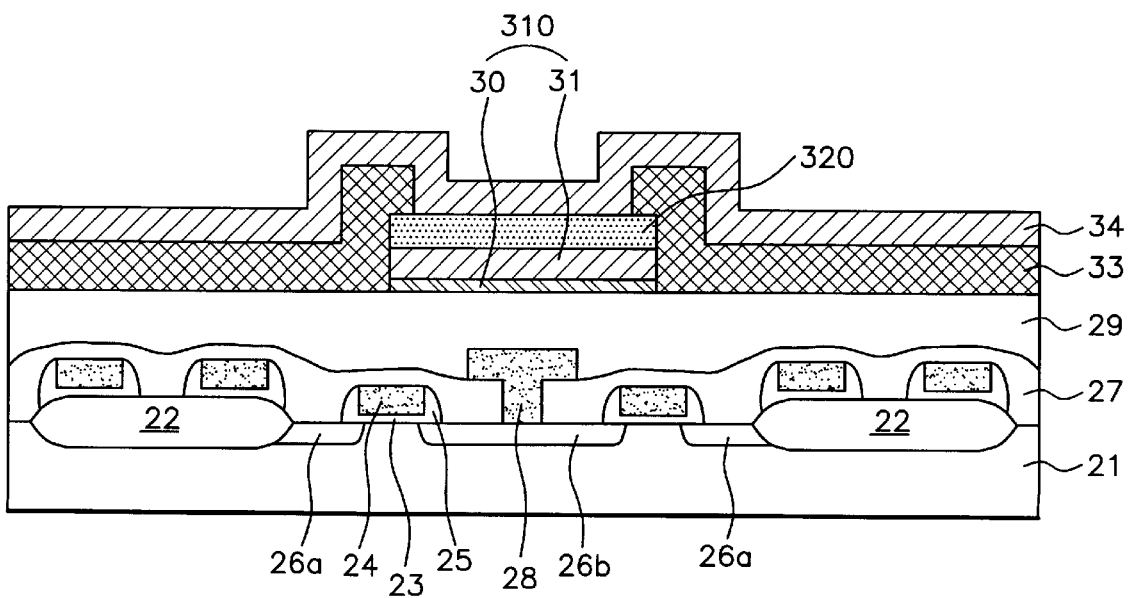

Referring to FIG. 2D, a resist pattern is formed on the dielectric protection film 33 and the dielectric protection film 33 is etched using the resist pattern as a mask to expose the dielectric film 320. The resist pattern is removed. a second conduction layer 34 for plate node, for example Pt layer is formed over the dielectric protection film 33 to be contacted with the dielectric film 320 at a thickness of 1000 to 3000 Å.

Figure 2E:
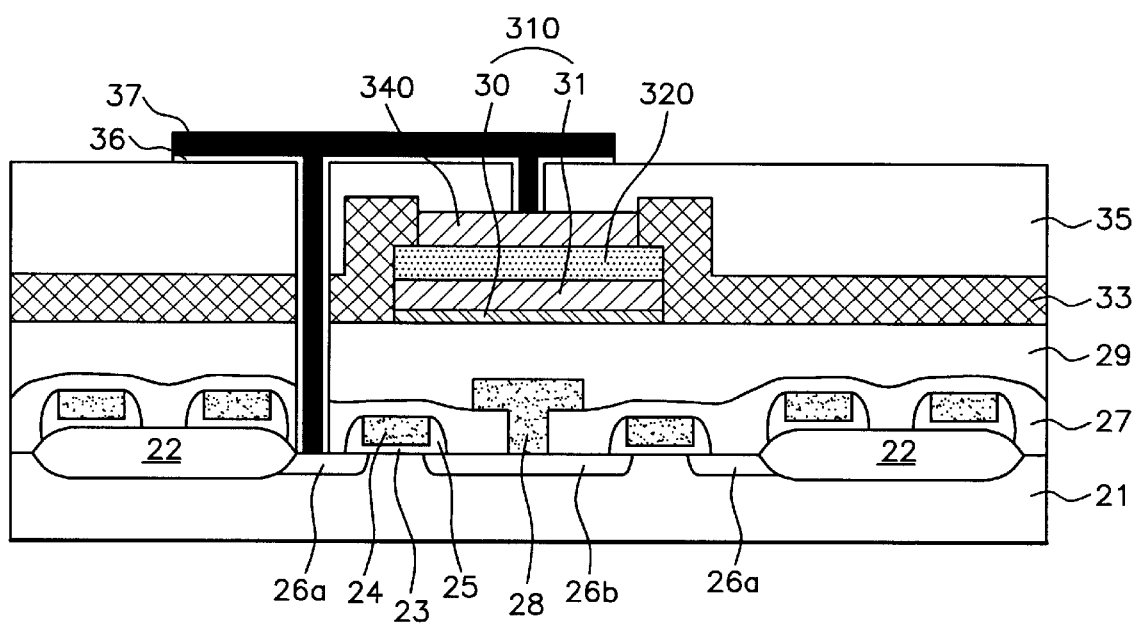

Referring to FIG. 2E, the second conduction layer 34 is patterned to remain on the exposed dielectric film 320, thereby forming a plate node 340. A third intermediate insulating layer 35 is formed over the dielectric protection film 33 and the plate node 340. The planarization film may be preferably used for the third intermediate insulating layer 35. Although a high temperature process is carried out to form the third intermediate insulating layer 35, the protection film 33 covers the dielectric film so that Bi is not volatile and does not reacted with chemicals of the third intermediate insulating layer 35.

The first to third intermediate insulating layers 27, 29 and 35 and the dielectric protection film 33 are selectively etched to expose the source region 26a and the plate node 340, thereby forming contact holes. A barrier metal layer 36 is formed over the third intermediate insulating layer 35 to be contacted with the source region 26a and the plate node 340 through the contact holes and then the metal interconnection layer 37 is formed on the barrier metal to electrically connect the source region 26a with the plate node 340.

According to the present invention, the protection film is formed to cover the dielectric film so that the dielectric film is chemically and thermally stable in the following etching or high temperature thermal oxidation process, thereby preventing Bi within the dielectric film being volatile. Therefore, the hysterisis property of the dielectric film can be improved and leakage current can be reduced.

This invention does not limit the above embodiment. This invention forms the dielectric protection film and the plate node following formation of the storage node and the dielectric film. However, although the dielectric protection film is formed following the storage node, the dielectric film and the plate node, this invention can obtain the same effect as the above embodiment.

While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A method for fabricating a ferroelectric memory device, comprising the steps of:

providing a semiconductor substrate where a transistor having an impurity region is formed;

forming a conduction layer for a storage node over the substrate;

furnace-annealing the conduction layer;

forming a first ferroelectric film on the conduction layer;

rapid-thermally annealing the first ferroelectric film;

forming a second ferroelectric film on the first ferroelectric film;

rapid-thermally annealing the second film on the first ferroelectric film;

furnace-annealing the first and second ferroelectric films;

patterning the conduction layer and the ferroelectric films to form a storage node and a dielectric film;

forming a protection film for protecting the dielectric film over the semiconductor substrate to cover the storage node and the dielectric film;

patterning the protection film to expose a selected portion of the dielectric film; and forming a plate node on the dielectric film.

2. The method as claimed in claim 1, further comprising the step of forming a glue layer over the semiconductor substrate before formation of the conduction layer.

3. The method as claimed in claim 2, wherein the glue layer is comprised of one of a Ti layer or a Ta layer.

4. The method as claimed in claim 2, wherein the glue layer is formed at a thickness of 100 to 1000 Å.

5. The method as claimed in claim 1, wherein the conduction layer for the storage node is comprised of a Pt layer.

6. The method as claimed in claim 5, the conduction layer for the storage node is formed at a thickness of 1000 to 5000 Å.

7. The method as claimed in claim 1, wherein the furnace-annealing of the conduction layer is carried out at a temperature of 500 to 700° C. during 10 to 60 minutes at ambient of oxygen and the furnace-annealing of the first and second ferroelectric films is at 700 to 800° C. during 10 to 60 minutes at ambient of oxygen.

8. The method as claimed in claim 1, wherein the ferroelectric films are formed with spin coating.

9. The method as claimed in claim 1, wherein the ferroelectric films are comprised of SrBi2Ta2O9 (SBT) film.

10. The method as claimed in claim 9, wherein the formation step of the SBT films includes the steps of:

forming a first SBT film over the conduction layer for storage node;

drying the first SBT film;

rapid-thermally annealing the dried first SBT film;

drying the second SBT film; rapid-thermally annealing the dried second SBT film; and, furnace-annealing the first and second SBT films after the rapid-thermally annealing step of the dried second SBT film.

11. The method as claimed in claim 10, wherein the furnace annealing step for the first and second SBT films is carried out at a temperature of 700 to 800° C. during 10 to 60 minutes at ambient of oxygen.

12. The method as claimed in claim 10, wherein the first and second SBT films are first dried at a temperature of 160 to 180° C. during 1 to 5 minutes and then second dried at a temperature of 260 to 280° C. during 1 to 5 minutes.

13. The method as claimed in claim 10, wherein the rapid-thermally annealing step is carried out at a temperature of 600 to 800° C. during 10 to 60 seconds at ambient of oxygen.

14. The method as claimed in claim 10, wherein the first and second SBT films are formed at a thickness of 800 to 1200 Å, respectively.

15. The method as claimed in claim 1, wherein the protection film for dielectric film is comprised of SrTiO3.

16. The method as claimed in claim 15, wherein the protection film is deposited at a temperature of 300 to 550° C. with chemical vapor deposition.

17. The method as claimed in claim 15, wherein the protection film is deposited at a thickness of 500 to 2000 Å.

18. The method as claimed in claim 1, where the plate node is comprised of a Pt layer.

19. The method as claimed in claim 1, further comprising the steps of forming an intermediating insulating layer over the protection film and the plate node; etching the intermediating layer to expose the impurity region of the transistor and the plate node, thereby forming contact holes; and forming a metal interconnection layer over the intermediate insulating layer to be contacted with the impurity region and the plate node through the contact holes.

* * * * *